United States Patent [19]
Liu

[11] Patent Number: 6,031,269
[45] Date of Patent: *Feb. 29, 2000

[54] QUADRUPLE GATE FIELD EFFECT TRANSISTOR STRUCTURE FOR USE IN INTEGRATED CIRCUIT DEVICES

[75] Inventor: Yowjuang William Liu, San Jose, Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/844,146

[22] Filed: Apr. 18, 1997

[51] Int. Cl.[7] .......................... H01L 27/01; H01L 27/12; H01L 31/0392
[52] U.S. Cl. ..................... 257/347; 257/350; 438/157
[58] Field of Search ..................... 257/347–351, 257/679; 438/156–160, 164

[56] References Cited

U.S. PATENT DOCUMENTS

| | | | |
|---|---|---|---|
| 4,996,574 | 2/1991 | Shirasaki | 257/347 |
| 5,120,666 | 6/1992 | Gotou | 438/157 |
| 5,346,834 | 9/1994 | Hisamoto et al. | 438/164 |
| 5,420,048 | 5/1995 | Kondo | 438/157 |
| 5,451,798 | 9/1995 | Tsuda et al. | 257/347 |
| 5,482,877 | 1/1996 | Rhee | 438/157 |
| 5,497,019 | 3/1996 | Mayer et al. | 257/347 |
| 5,581,101 | 12/1996 | Ning et al. | |
| 5,689,136 | 11/1997 | Usami et al. | 257/679 |

FOREIGN PATENT DOCUMENTS

| | | | |
|---|---|---|---|
| 3-288471 | 12/1991 | Japan . | |
| 403288471 | 12/1991 | Japan | 257/347 |

OTHER PUBLICATIONS

Patent application for Multilayer Quadruple Gate Filed Effect Transistor Structure for Use in Integrated Circuit Devices; filed Apr. 18, 1997, by Yowjuang W. Liu, Ser. No. 08/837,557.

Patent application for Multilayer Floating Gate Field Effect Transistor Structure for Use in Ingtegrated Circuit Devices; filed Apr. 18, 1997, by Yowjuang W. Liu, Ser. No. 08/837,556.

*Primary Examiner*—Tom Thomas
*Assistant Examiner*—Cuong Q. Nguyen
*Attorney, Agent, or Firm*—Foley & Lardner

[57] ABSTRACT

A quadruple gate field effect transistor (FET) is provided in a silicon-on-insulator or semiconductor-on-insulator (SOI) structure. The silicon substrate is surrounded by a polysilicon material on at least three sides to form a gate. Additionally, the substrate can be surrounded by a fourth side to form a quadruple gate structure. The quadruple gate provides superior current densities across the channel region of the FET. A metal via can be provided to the silicon substrate to avoid floating substrate effects. A flexible support substrate may be coupled to an oxide layer.

20 Claims, 3 Drawing Sheets

QUADRUPLE GATE FIELD EFFECT TRANSISTOR STRUCTURE FOR USE IN INTEGRATED CIRCUIT DEVICES

FIELD OF THE INVENTION

The present invention relates to integrated circuit devices. More particularly, the present invention relates to a field effect transistor (FET) structure for use in integrated circuit devices.

BACKGROUND OF THE INVENTION

Semiconductor devices, such as, complementary metal oxide semiconductor (CMOS) integrated circuits, generally include field effect transistors (FETS) which are disposed in a single plane of a semiconductor substrate. Basically, semiconductor devices can be bulk semiconductor-type devices or semiconductor-on-insulator-type devices, such as, silicon-on-insulator (SOI) devices. Bulk semiconductor devices can include field effect transistors (FETs) which are manufactured as lateral or vertical devices disposed on a silicon substrate.

In bulk semiconductor-type devices which have lateral FETs, a top surface of the substrate is doped to form source and drain regions, and a gate conductor is provided on the top surface of the semiconductor substrate between the source and drain regions. In operation, an electric field is generated in a channel region between the source and drain regions (e.g., below the gate conductor) by an electric signal provided to the gate conductor. The electric field causes charge carriers to be conducted across the channel region along essentially the top surface of the semiconductor substrate. The electric field penetrates the channel region from one direction because the gate conductor is only located over the top surface of the channel region. The current density associated with the FET is somewhat limited because the current only travels near the top surface of the substrate (e.g., the current is one-dimensional).

In bulk semiconductor-type devices which have vertical FETs, the semiconductor substrate, such as, a silicon substrate, is etched to form trenches or steps. The gate of the vertical transistor is disposed on a side wall of the trench or step. A channel region is located adjacent to the side wall. Due to its small lateral size, the vertical transistor generally allows more devices to be contained than a single semiconductor substrate. Similar to conventional lateral FETs discussed above, the gate conductors are disposed on only one side of the channel region, and the current density associated with the vertical FET is somewhat limited.

Bulk semiconductor-type devices can be subject to some disadvantageous properties, such as, less than ideal subthreshold voltage slope during operation, high junction capacitance, and ineffective isolation. Additionally, bulk semiconductor-type devices often require epilayers, P-wells, or N-wells which require additional fabrication steps.

SOI (e.g., silicon-on-insulator) devices have significant advantages over bulk semiconductor-type devices, including near ideal subthreshold voltage slope, low junction capacitance, and effective isolation between devices. SOI-type devices generally completely surround a silicon or other semiconductor substrate with an insulator. Devices, such as, FETs or other transistors, are disposed on the silicon by doping source and drain regions and by providing gate conductors between the source and drain regions. SOI devices provide significant advantages, including reduced chip size or increased chip density, because minimal device separation is needed due to the surrounding insulating layers. Additionally, SOI devices can operate at increased speeds due to reductions in parasitic capacitance.

Similar to conventional bulk semiconductor-type devices discussed above, conventional SOI devices have somewhat limited current density because the gate conductor is provided only on one side of the channel region. Additionally, conventional SOI devices generally have a floating substrate (the substrate is often totally isolated by insulating layers). Accordingly, SOI devices are subject to floating substrate effects, including current and voltage kinks, thermal degradation, and large threshold voltage variations. Also, SOI devices often have a leakage path at the bottom (e.g., opposite the gate) silicon and insulator interface.

Thus, there is need for a FET which has improved density, increased operating speed, and higher current density. Further, there is a need for a FET which does not require a N-well or a P-well. Further still, there is a need for a SOI-type FET which is not subject to floating substrate effects.

SUMMARY OF THE INVENTION

The present invention relates to a field effect transistor for use in a highly integrated circuit. The field effect transistor includes a bar-shaped portion of a semiconductor substrate, a first gate insulating material, a first gate conducting material, a first dielectric layer, a source contact, and a drain contact. The bar-shaped portion has a middle section, a first end section, and a second end section. The first gate insulating material surrounds at least three sides of the middle section of the bar-shaped portion of the semiconductor substrate. The first gate conducting material is situated over the gate insulating material. The first dielectric layer is situated over the first gate conducting material, over at least three sides of the first end section of the bar-shaped portion, and over at least three sides of the second end section of the bar-shaped portion. The source contact is coupled to the first end section of the bar-shaped portion, and the drain contact is coupled to the second end section of the bar-shaped portion.

The present invention further relates to a method of making a field effect transistor. The method includes: providing a stepped structure in a first surface of a semiconductor substrate; providing a first conducting material over a first side wall, over a second side wall, and over a top of the stepped structure; providing a first insulating material over the first conducting material; removing the semiconductor substrate at the second surface of the semiconductor substrate; and providing source and drain contacts to the stepped structure of the semiconductor substrate. The substrate is removed until approximately the bottom of the stepped structure is reached. A gate for the field effect transistor is formed whereby the first conducting material is disposed over the first side wall, the second side wall, and the top of the stepped structure.

The present invention still further relates to a silicon-on-insulator integrated circuit. The integrated circuit includes a plurality of portions of a semiconductor material physically isolated from each other by a deposited insulating material, a first gate conducting material, a plurality of source contacts, and a plurality of drain contacts. The first gate conducting material surrounds at least three sides of a middle section of each of the portions. Each of the plurality of source contacts is coupled to a first end section of one of the bar-shaped portions. Each of the plurality of drain contacts is coupled to a second end section of one of the portions. Each portion includes a channel region for a field effect transistor.

In one aspect of the present invention, a SOI FET device has near ideal subthreshold voltage slope, low junction capacitance, and effective isolation as well as increased current density. The FET can have a non-floating (e.g., a biased) substrate to reduce floating substrate effects, such as, current and voltage kinks, thermal degradation, and large voltage variations. The substrate is rectangular or bar-shaped.

In another aspect of the present invention, a quadruple gate FET structure provides wider channel conduction for higher drive current. The quadruple gate construction provides three-dimensional current within the channel region of the substrate on the SOI-type device. The current is driven in a rectangular cross section and is not limited to the top surface of the substrate. The surrounded gate structure improves current drive characteristics of the FET, provides a more uniform electric field in the channel region, and reduces hot carrier injection reliability limitations.

In accordance with another aspect of the present invention, epilayers, N-wells, and P-wells are not required, thereby making the device easier to manufacture. Requirements for special polydoping and boron penetration are also not necessary. Preferably, the method of making the quadruple gate devices is compatible with conventional bulk silicon and SOI fabrication processes.

BRIEF DESCRIPTION OF THE DRAWINGS

Preferred embodiments of the invention will hereinafter be described in conjunction with the appended drawings wherein like numerals denote like elements, and.

DETAILED DESCRIPTION OF THE PREFERRED EMBODIMENTS

Figure 1:
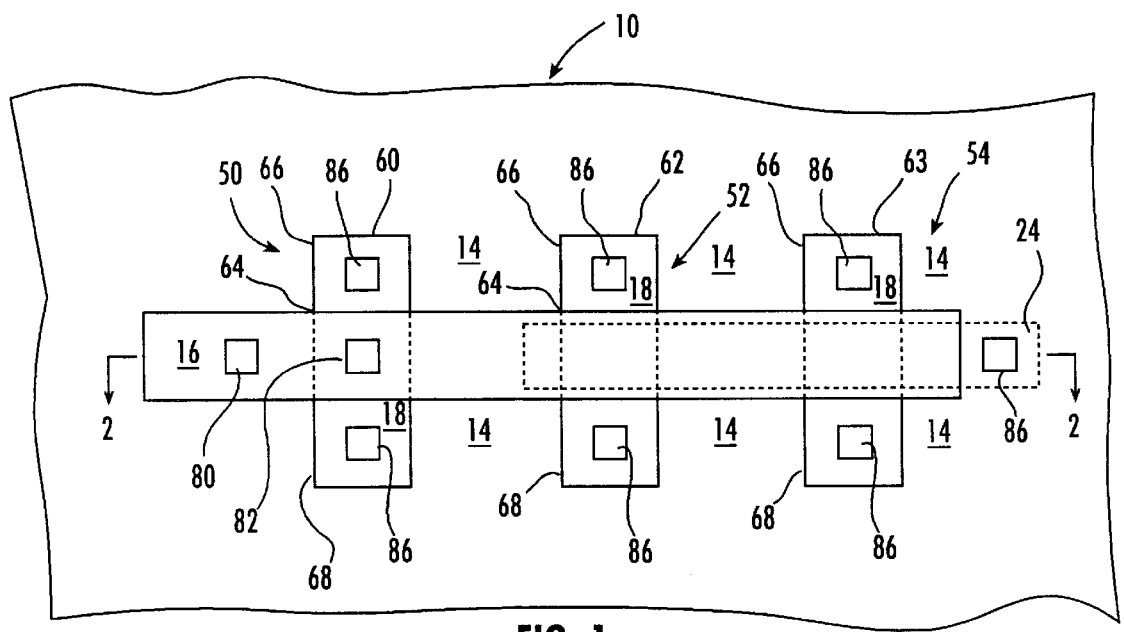
FIG. 1 is a bottom view of an integrated circuit in accordance with an exemplary embodiment of the present invention.
Figure 2:
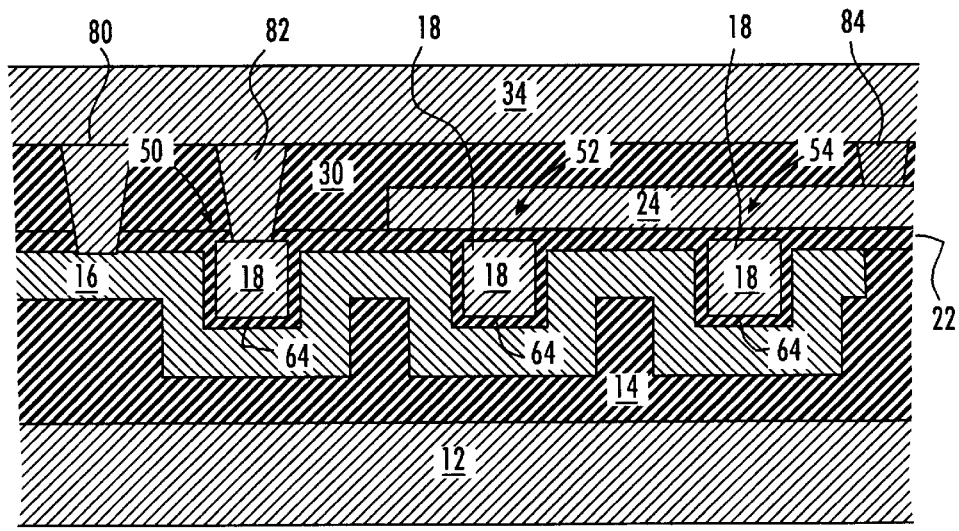
FIG. 2 is a cross-sectional view of the integrated circuit illustrated in FIG. 1 about line 2—2.

With reference to FIGS. 1 and 2, a semiconductor-on-insulator (SOI), such as, a silicon-on-insulator integrated circuit 10, includes a support substrate 12, an insulating layer 14, a conducting layer 16, a silicon substrate 18, an insulating layer 22, a conducting layer 24, an insulating layer 30, and a metal layer 34. FIG. 1 shows a bottom view of circuit 10 from just below layer 16.

Support substrate 12 can be a semiconductor material, an insulating material, or other substance that provides a base for integrated circuit 10. Support substrate 12 can be silicon dioxide, silicon, or a flexible material. Support substrate 12 is attached to insulating layer 14 by an adhesive or by other bonding material, and substrate 12 is preferably a flexible material (e.g., fiberglass).

Insulating layers 14 and 30 can be any dielectric or insulating material. Preferably, layers 14 and 30 are a deposited high-temperature oxide, such as, TEOS-based oxide, silicon dioxide, spin-on-glass (SOG), PECVDTEOS oxide, SiH$_4$-based PECVD oxide, or a two layer glass and nitride material. Conducting layers 16 and 24 are polysilicon (doped) or polycide layers. Layers 16 and can be any conducting material, including titanium, amorphous silicon, metals, tungstens, or other conductors. Layers 16 and 24 can be deposited by evaporation, collimated sputtering, physical vapor deposition, sputter deposition, chemical vapor deposition (CVD), or other deposition techniques. Layers 16 and 24 can also be a sandwich structure including polycide and polysilicon layers to reduce resistivity.

As shown in FIGS. 1 and 2, in an exemplary fashion only, integrated circuit 10 includes a transistor 50, a transistor 52, and a transistor 54. Transistors 50, 52, and 54 are preferably field effect transistors (FETs). Transistor 50 is provided on a bar-shaped semiconductor portion 60 of substrate 18. Transistor 52 is provided on a bar-shaped portion 62 of semiconductor substrate 18. Transistor 54 is provided on a bar-shaped portion 63 of semiconductor substrate 18. Substrate 18 is preferably silicon and is divided into discrete rectangular prisms or bar-shaped portions 60, 62, and 63, although cylindrical or other geometries for portions 60, 62, and 63 of substrate 18 are possible.

Each of transistors 50, 52, and 54 is comprised of a gate region 64, a source region 66, and a drain region 68. Gate region 64 is provided between regions 66 and 68 and represents a channel region for transistors 50, 52, and 54. Regions 66 and 68 are preferably doped semiconductor regions provided in substrate 18. Transistors 50, 52, and 54 can be a N-channel, a P-channel, or other type of transistor.

Portions 60, 62, and 63 of substrate 18 are advantageously isolated from each other by insulating layers 14 and 22. The isolation associated with layers 14 and 22 enables transistors 50, 52, and 54 to have low junction capacitance relative to conventional bulk-type semiconductor devices.

Gate 64 of each of transistors 50, 52, and 54 is advantageously formed by conducting layer 16. Conducting layer 16 is provided on at least three sides of a middle section of portions 60, 62, and 63. Layer 16 is also provided over insulating layer 22, which is preferably a thermally grown oxide. Layer 22 is provided on all four sides of the portions 60, 62, and 63 and operates as a gate oxide. Thus, layer 16 essentially surrounds portions 60, 62, and 63 and, thereby, is able to provide an electric field in three dimensions into the channel region of transistors 50, 52, and 54 (portions 60, 62, and 63, respectively).

Metal layer 34 can be connected to conducting layer 16 by a via 80. Vias 86 can be coupled to each source region 66 and drain region 68 associated with transistors 50, 52, and 54. Vias 86 are coupled to opposite ends of portions 60, 62, and 63. Metal layer 34 can be aluminum, gold, polysilicon, or other conductive material.

Layer 34 can also provide a substrate bias signal to the channel region of transistor 50. A via 82 couples metal layer 34 to the channel region of transistor 50 (e.g., portion 60). Substrate 18 associated with transistor 50 is, thus, biased through via 82. Therefore, floating substrate effects can be reduced with respect to transistor 50 because substrate 18 is not a floating substrate. A via (not shown) similar to via 82 can also be coupled to portions 62 and 63 (preferably isolated from layer 24) to provide a bias signal to the channel region of transistors 52 and 54, respectively. Integrated circuit 10 provides significant advantages, including most of the advantages associated with integrated circuits manufactured from SOI techniques, and yet eliminates floating substrate problems by the use of via 82 associated with transistor 50.

Additionally, metal layer 34 can be coupled to conducting layer 24 by via 84. Transistors 52 and 54 include portions 62 and 63 which are surrounded on all four sides by the combination of conducting layers 16 and 24. The combination of conducting layers 16 and 24 thus, provides a quadruple gate structure that supplies an electric field on all four sides of portion 62 and 63. Moreover, the quadruple gate structure associated with transistors 52 and 54 provides a more uniform channel field distribution, thereby minimizing or eliminating hot carrier injection problems associated with the conventional FETs.

Surrounding portions 60, 62, and 63 by layer 16 provides a three-dimensional, wide channel conduction for high gain for each of transistors 50, 52, and 54. Providing layer 24 yields even more uniform channel field distributions because each side of portions 60, 62, and 63 is surrounded by a gate conductor. Special polygate doping is not needed for minimization of short channel effects because the quad gate structure can more precisely control off-state leakage. Additionally, layers 16 and 24 can be biased separately to optimize performance of transistors 52 and 54 for high drive current and to minimize off-state leakage. For example, layer 24 can be reverse biased to pinch off-leakage paths.

Layer 24 can advantageously reduce the leakage path associated with the bottom silicon and insulator interface in the conventional SOI device. The integrated circuit illustrated in FIG. 1 has a denser layout because there is direct access to substrate 18 and gate 16 through the top of circuit 10. Additionally, the structure is fully planarized (on both sides) by planarazation techniques, such as a chemical mechanical planarazation process. Being fully planarized contributes to the ability of providing multi-layers and increasing the packing density associated with the device.

Figure 3:
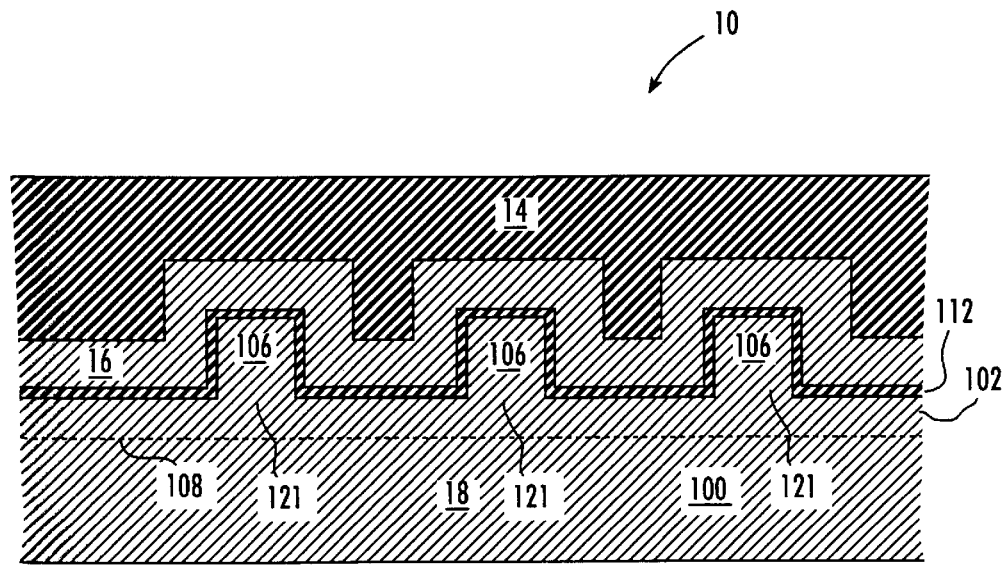
FIG. 3 is a cross-sectional view of the integrated circuit illustrated in FIG. 2 before the substrate is etched and before source and drain contacts are provided.

The manufacture of integrated circuit 10 is discussed with reference to FIGS. 1–6 below. In FIG. 3, substrate 18, which is preferably silicon, includes a heavily doped region 100 and a lightly doped region 102. However, in FIG. 3, integrated circuit 10 is shown without metal layer 34, layer 24, vias 80, 82, and 84, and in an upside down orientation in comparison to FIGS. 1, 2 and 4–6. Stepped structures 106 are formed above a boundary line 108 between lightly doped region 102 and heavily doped region 100. Substrate 18 is preferably etched or otherwise shaped to form stepped structures 106. Structures 106 have two side walls, a top, and a bottom. Substrate 18 can be etched by reactive ion etching (RIE), directional dry etching, planarization, or other removal techniques.

After stepped structures 106 are formed, a thin gate oxide layer 112 is thermally grown on the exposed surfaces of structures 106. Layer 112 becomes a part of layer 22, as described below with reference to FIG. 6. Layer 112 is preferably silicon dioxide. Layer 16 is preferably 1000 to 10000 Angstroms (A) thick (e.g., 5000 A) and deposited by CVD as a conformal laxer. Stepped structures 106 can be any dimensions and can have a vertical height of 0.1 microns from bottom surface 121 to layer 112 and a width of 0.1 microns.

Conducting layer 16 is deposited over layer 112. Insulating layer 14 is deposited over layer 16. Layer 14 can be 0.5 to 2 microns thick and completely covers layer 16. Layer 14 is preferably polished back to form a smooth surface. The thickness of layer 14 can affect the heat conductivity and coupling capacitance associated with circuit 10.

Figure 4:
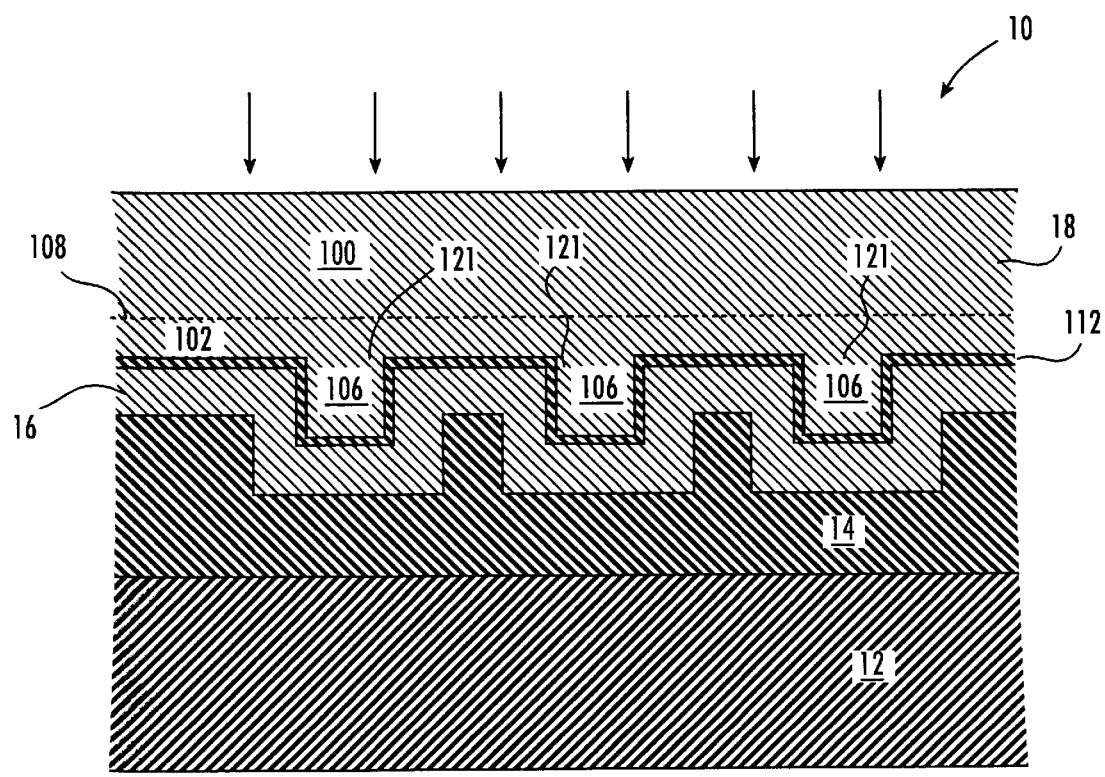
FIG. 4 is a cross-sectional view of the integrated circuit illustrated in FIG. 3 when the substrate is being etched.

Integrated circuit 10 is flipped over from its orientation in FIG. 3 and etched, as shown in FIG. 4. Before etching substrate 18, layer 14 is preferably bonded to support substrate 12. Substrate 18 of integrated circuit 10 is polished to remove heavily doped region 100 to boundary line 108. Boundary line 108 provides an etch stop area for chemical, mechanical polishing of substrate 18. Once lightly doped region 102 is reached, substrate 18 is preferably further etched by reactive ion etching until a bottom surface 121 of stepped structures 106 is reached.

Figure 5:
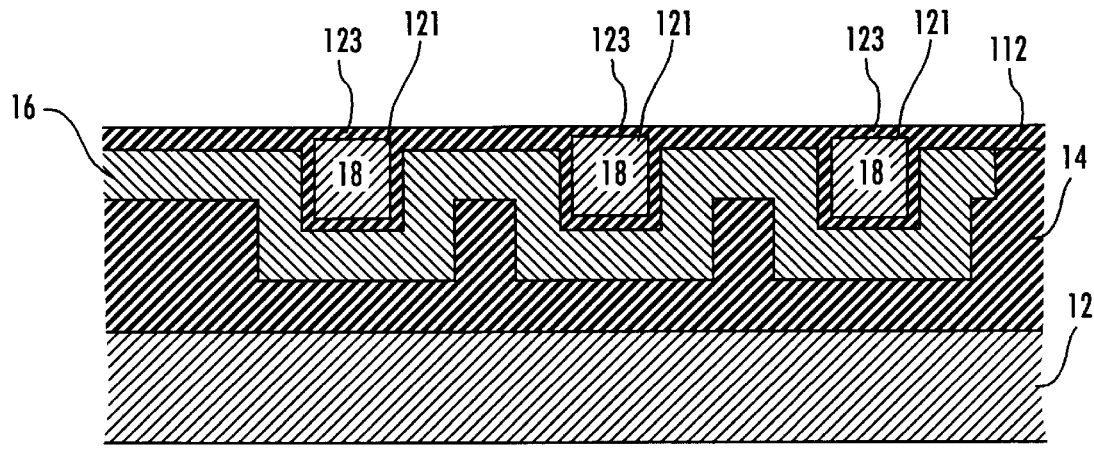
FIG. 5 is a cross-sectional view of the integrated circuit illustrated in FIG. 3 after the substrate is etched and before the second gate conductor layer is provided.

With reference to FIG. 5, bottom surface 121 of stepped structures 106 is oxidized to form a layer 123. Layers 112 and 123 combine to form layer 22 (FIGS. 1 and 2).

Figure 6:
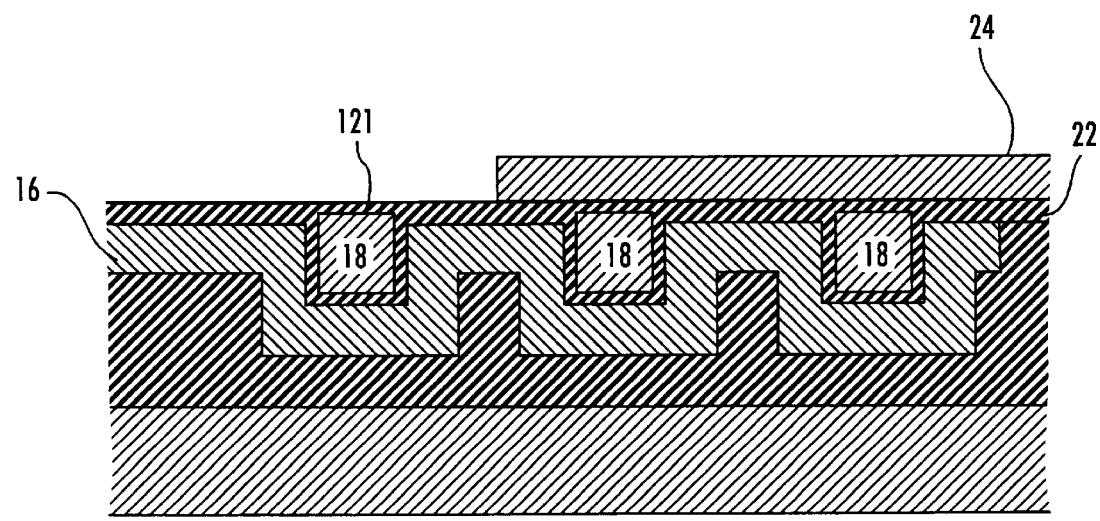
FIG. 6 is a cross-sectional view of the integrated circuit illustrated in FIG. 5 after the second gate conductor layer is provided.

Due to the compositional differences in structures 106 (e.g., silicon) and in layer 16 (e.g., polysilicon), layer 123 grows at different rates on surface 121 than on layer 16. Preferably, layer 123 is thicker over layer 16 than over surface 121. After layer 123 is thermally grown, thereby forming layer 22 with layer 112, layer 24 is deposited over layer 22 (FIG. 6). Layer 24 is preferably a layer similar to layer 16 in material and in dimension. Layer 22 is preferably 50 A thick around portions 60, 62, and 63. Layer 22 can be a different thickness between layer 16 and substrate 18 than between layer 24 and substrate 18. In this way, the performance of circuit 10 can be optimized for particular applications.

With reference to FIG. 2, layer 30 is deposited on top of layers 24 and 22. Layer 30 is 0.5 to 2 microns thick and can be etched to provide holes for conductive vias 80, 82, 84, and 86. Vias 80, 82, 84, and 86 can be aluminum, tungsten, polysilicon, or other conductive material. After selectively etching layer 30, the holes are filled with a conductive material to form vias 80, 82, 84, and 86. After vias 80, 82, 84, and 86 are formed, metal layer 34 is deposited and subsequently etched to form appropriate connections for integrated circuit 10.

It is understood that, while the detailed drawings and specific examples describe the exemplary embodiments in the present invention, they are there for the purpose of illustration only. The apparatus and method of the invention is not limited to the precise details, geometries, dimensions, materials, and conditions disclosed. For example, although particular layers are described as being particular sizes, other sizes can be utilized. Further, although polysilicon is used as a gate conductor, other conductor materials can be utilized. Further still, the drawings are not drawn to scale. Various changes can be made to the precise details discussed without departing from the spirit of the invention which is defined by the following claims.

What is claimed is:

1. A silicon-on-insulator field effect transistor for use in a highly integrated circuit, the field effect transistor comprising:
   a support substrate;
   a bar-shaped portion of a semiconductor substrate, the bar-shaped portion having a middle section, a first end section, and a second end section;
   a first gate insulating material surrounding at least three sides of the middle section of the bar-shaped portion of the semiconductor substrate;
   a first gate conducting layer situated over the gate insulating material, the first gate conducting layer covering only three sides of the first gate insulating material;
   a first dielectric layer situated over the first gate conducting layer, over at least three sides of the first end section of the bar-shaped portion, and over at least three sides of the second end section of the bar-shaped portion, the first dielectric layer being between the support substrate and the first gate conducting layer;

a source contact coupled to the first end section of the bar-shaped portion; and a drain contact coupled to the second end section of the bar-shaped portion.

2. The field effect transistor of claim 1 further comprising:

a second gate insulating material situated over a fourth side of the middle section of the bar-shaped portion of the semiconductor substrate; and a second gate conducting material situated over the second gate insulating material.

3. The field effect transistor of claim 2 wherein a second insulating layer is situated over the second gate conducting material, over a fourth side of the first end section of the bar-shaped portion, and over a fourth side of the second end section of the bar-shaped portion, wherein the second insulating layer includes a plurality of holes for receiving the source contact and the drain contact.

4. The field effect transistor of claim 1 further comprising a substrate contact coupled to a fourth side of the middle section of the bar-shaped portion of the semiconductor substrate, the substrate contact being provided through the second insulating layer.

5. The field effect transistor of claim 2 wherein the first gate conducting layer and the second gate conducting material include polysilicon.

6. The field effect transistor of claim 5 wherein the first gate insulating material includes thermally grown oxide.

7. A silicon-on-insulator integrated circuit, comprising:

a support substrate;

a plurality of portions of a semiconductor material physically isolated from each other by a deposited insulating material;

a first gate conducting material surrounding only three sides of a middle section of each of the portions and disposed between the support substrate and the semiconductor material;

a plurality of source contacts, each coupled to a first end section of one of the bar-shaped portions; and a plurality of drain contacts, each coupled to a second end section of one of the bar-shaped portions, whereby each portion includes a channel region for a field effect transistor.

8. The integrated circuit of claim 7 further comprising:

at least one substrate contact coupled to the middle section of at least one of the portions.

9. The integrated circuit of claim 7 wherein the support substrate is coupled to the insulating material.

10. The integrated circuit of claim 9 further comprising:

a second gate conducting material situated over a fourth side of at least one of the portions, the fourth side being opposite the support substrate.

11. The integrated circuit of claim 10 further comprising:

an insulating layer disposed over the second gate conducting material; and a metal layer disposed over the insulating layer.

12. The integrated circuit of claim 7 wherein the portions are floating.

13. A silicon-on-insulator field effect transistor for use in a highly integrated circuit, the field effect transistor being manufactured by a method comprising:

providing a stepped structure in a first surface of a semiconductor substrate, the stepped structure having a first side wall, a second side wall, a top, and a bottom, the top being opposite the bottom, the first surface being opposite a second surface;

providing a first conducting material over only the first side wall of the stepped structure, the second side wall of the stepped structure, and the top of the stepped structure, the first conducting material not being disposed over a fourth wall of the stepped structure;

providing a first insulating material over the first conducting material;

attaching a support substrate to the first insulating material;

removing the semiconductor substrate at the second surface of the semiconductor substrate approximately until the bottom of the stepped structure is reached; and providing source and drain contacts to the stepped structure of the semiconductor substrate, whereby a gate of the field effect transistor is formed when the first conducting material is disposed over the first side wall, the second side wall, and the top of the stepped structure.

14. The field effect transistor of claim 13, the field effect transistor being manufactured by a method further comprising:

providing a second conducting material over the second surface after the removing step, whereby the gate of the field effect transistor is formed when the first conducting material is disposed over the first side wall of the stepped structure, the second side wall of the stepped structure, and the bottom of the stepped structure, and the second conducting material is disposed over the second surface of the semiconductor substrate.

15. The field effect transistor of claim 13, wherein the source and drain contacts are provided to the stepped structure of the semiconductor substrate at the second surface of the semiconductor substrate after the removing step.

16. The field effect transistor of claim 14, the field effect transistor being manufactured by a method further comprising:

providing a first gate insulating material over the first side wall of the stepped structure, the second side wall of the stepped structure, and the top of the stepped structure before the providing of the first conducting material step.

17. The field effect transistor of claim 16, wherein the gate insulating material is a thermally grown oxide.

18. The field effect transistor of claim 17, the field effect transistor being manufactured by a method further comprising:

providing a second gate insulating material on the second surface of the semiconductor material after the removing step.

19. The field effect transistor of claim 14, the field effect transistor being manufactured by a method further comprising:

attaching the support substrate to the first insulating layer with an adhesive.

20. The field effect transistor of claim 19, wherein the support substrate is flexible.

* * * * *